(12) United States Patent
Wang et al.

(10) Patent No.: US 12,010,412 B2
(45) Date of Patent: Jun. 11, 2024

(54) CAMERA MODULE AND PHOTOSENSITIVE ASSEMBLY THEREOF, ELECTRONIC DEVICE, AND MANUFACTURING METHOD

(71) Applicant: NINGBO SUNNY OPOTECH CO., LTD., Zhejiang (CN)

(72) Inventors: Mingzhu Wang, Zhejiang (CN); Takehiko Tanaka, Zhejiang (CN); Xiaodi Liu, Zhejiang (CN); Zhen Huang, Zhejiang (CN); Zhenyu Chen, Zhejiang (CN)

(73) Assignee: NINGBO SUNNY OPOTECH CO., LTD., Zhejiang (CN)

( * ) Notice: Subject to any disclaimer, the term of this patent is extended or adjusted under 35 U.S.C. 154(b) by 297 days.

(21) Appl. No.: 17/607,947

(22) PCT Filed: Feb. 28, 2020

(86) PCT No.: PCT/CN2020/077142
§ 371 (c)(1),
(2) Date: Nov. 1, 2021

(87) PCT Pub. No.: WO2020/220815
PCT Pub. Date: Nov. 5, 2020

(65) Prior Publication Data
US 2022/0294940 A1   Sep. 15, 2022

(30) Foreign Application Priority Data
Apr. 30, 2019 (CN) .......................... 201910360090.8

(51) Int. Cl.
*H04N 23/54* (2023.01)
*H04N 23/55* (2023.01)
*H04N 23/57* (2023.01)

(52) U.S. Cl.
CPC .............. *H04N 23/54* (2023.01); *H04N 23/55* (2023.01); *H04N 23/57* (2023.01)

(58) Field of Classification Search
CPC ........ H04N 23/54; H04N 23/55; H04N 23/57; H04N 23/50; H01L 27/14618
See application file for complete search history.

(56) References Cited

U.S. PATENT DOCUMENTS

2001/0030276 A1   10/2001   Hoshino
2006/0268144 A1   11/2006   Tan et al.
(Continued)

FOREIGN PATENT DOCUMENTS

CN   101232033   7/2008
CN   102263887   11/2011
(Continued)

OTHER PUBLICATIONS

International Search Report dated May 27, 2020, in International (PCT) Application No. PCT/CN2020/077142, with English translation.
(Continued)

Primary Examiner — Timothy J Henn
(74) Attorney, Agent, or Firm — WENDEROTH, LIND & PONACK, L.L.P.

(57) ABSTRACT

A camera module and a photosensitive assembly thereof, an electronic device, and a manufacturing method are provided. The photosensitive assembly includes a photosensitive chip having a photosensitive area and an electric connection area located around the photosensitive area, at least one resistance-capacitance device, a conducting element, an expanded wiring layer, and a molded base. The expanded wiring layer has a top surface and a bottom surface. The at least one resistance-capacitance device is electrically connected to the bottom surface of the expanded wiring layer.

(Continued)

The conducting element extends between the bottom surface of the expanded wiring layer and the electric connection area of the photosensitive chip, so as to electrically connect the photosensitive chip to the expanded wiring layer by means of the conducting element. A light hole is formed in the expanded wiring layer, and the light hole corresponds to at least the photosensitive area of the photosensitive chip. The molded base is integrally combined with the photosensitive chip, the at least one resistance-capacitance device, and the expanded wiring layer.

20 Claims, 12 Drawing Sheets

(56) References Cited

U.S. PATENT DOCUMENTS

| | | | |
|---|---|---|---|
| 2008/0173792 A1 | 7/2008 | Yang et al. | |
| 2010/0103296 A1* | 4/2010 | Nakagiri | H04N 23/57 |
| | | | 257/E31.127 |
| 2011/0084118 A1 | 4/2011 | Wada et al. | |
| 2014/0036369 A1 | 2/2014 | Ushinsky et al. | |
| 2014/0252522 A1 | 9/2014 | Miyazaki et al. | |
| 2017/0194293 A1 | 7/2017 | Chang et al. | |
| 2017/0280027 A1 | 9/2017 | Wang et al. | |
| 2021/0075940 A1 | 3/2021 | Cao et al. | |
| 2022/0294943 A1* | 9/2022 | Wang | H01L 27/14618 |

FOREIGN PATENT DOCUMENTS

| | | |
|---|---|---|
| CN | 103337504 | 10/2013 |
| CN | 103400845 | 11/2013 |
| CN | 105681640 | 6/2016 |
| CN | 205610755 | 9/2016 |
| CN | 1905144 | 1/2017 |
| CN | 108922855 | 11/2018 |
| CN | 109104550 | 12/2018 |
| CN | 109461746 | 3/2019 |
| CN | 109936680 | 6/2019 |

OTHER PUBLICATIONS

Extended European Search Report dated May 9, 2022, in corresponding European Patent Application No. 20799356.9.

* cited by examiner

CAMERA MODULE AND PHOTOSENSITIVE ASSEMBLY THEREOF, ELECTRONIC DEVICE, AND MANUFACTURING METHOD

FIELD OF THE INVENTION

The disclosure relates to the field of camera modules, and more particularly, to a camera module using an expanded wiring assembly to electrically connect various components of the camera module, and a photosensitive assembly thereof, an electronic device, and a manufacturing method.

BACKGROUND OF THE INVENTION

In recent years, camera modules, as machine vision sensors, have been gradually incorporated into various types of electronic devices. Driven by this trend, consumer demands for camera functionality (e.g. high definition and high pixel) for consumer electronics and mobile computing devices (e.g. smart phones, smart wearable devices, and tablets) necessarily increase. The upgrade of imaging functions of camera modules is often accompanied by the increase of a hardware dimension (especially photosensitive chips). Meanwhile, consumers have a very high demand for miniaturization, thinness, portability, and other appearance factors of consumer electronics and mobile computing devices.

It can be understood that the miniaturization and thinness of consumer electronics and mobile computing devices are often contradictory to the upgrade of camera functions, and this contradiction will be intensified with the development of consumer electronics and mobile computing devices. Therefore, there is a continuing need for a camera module that can have a smaller size and higher imaging performance.

SUMMARY OF THE INVENTION

An object of the disclosure is to provide a camera module and a photosensitive assembly thereof, an electronic device, and a manufacturing method. The camera module is packaged by using an expanded wiring assembly and the expanded wiring assembly electrically connects a photosensitive chip and at least one resistance-capacitance device of the camera module, so that the camera module can be balanced with miniaturization of a physical dimension thereof at the time of realizing imaging quality upgrade.

Another object of the disclosure is to provide a camera module and a photosensitive assembly thereof, an electronic device, and a manufacturing method. The camera module no longer needs to conduct the photosensitive chip and the at least one resistance-capacitance device by means of a circuit extension element such as a lead wire by using the expanded wiring assembly, so that a series of problems caused by laying the circuit extension element are effectively avoided when the photosensitive chip needs to realize performance upgrade. That is, the expanded wiring assembly facilitates performance expansion of the photosensitive assembly.

Another object of the disclosure is to provide a camera module and a photosensitive assembly thereof, an electronic device, and a manufacturing method. The camera module does not need to electrically connect the photosensitive chip and the at least one resistance-capacitance device of the camera module by means of a circuit board, so that the camera module has a relatively small thickness, and favorably adapts to the current trend of thinness and miniaturization of electronic devices.

Another object of the disclosure is to provide a camera module and a photosensitive assembly thereof, an electronic device, and a manufacturing method. The expanded wiring assembly forms a top surface of the photosensitive assembly for mounting an optical lens or a lens carrying element of the camera module. The top surface formed by the expanded wiring assembly has a relatively high flatness, thereby facilitating mounting and calibration of the optical lens.

Another object of the disclosure is to provide a camera module and a photosensitive assembly thereof, an electronic device, and a manufacturing method. The at least one resistance-capacitance device and the photosensitive chip are electrically connected to the expanded wiring assembly and located on the same side of the expanded wiring assembly, so that space occupied by the photosensitive chip and the at least one resistance-capacitance device may be minimized.

Another object of the disclosure is to provide a camera module and a photosensitive assembly thereof, an electronic device, and a manufacturing method. The expanded wiring assembly includes a conducting element and an expanded wiring layer. The conducting element extends between the expanded wiring layer and the photosensitive chip so that a distance between the photosensitive chip and the top surface of the photosensitive assembly for mounting the optical lens or the lens carrying element is increased by means of the conducting element. Thus, an optical back focal dimension between the optical lens and the photosensitive chip of the camera module may meet optical design demands of the camera module.

Other advantages and features of the disclosure will become apparent from the following description and may be achieved by the means and combinations particularly pointed out in the appended claims.

In accordance with the disclosure, the foregoing and other objects and advantages are achieved by a photosensitive assembly including:

a photosensitive chip, including a photosensitive area and an electric connection area located around the photosensitive area;

at least one resistance-capacitance device;

an expanded wiring assembly, the photosensitive chip and the at least one resistance-capacitance device being electrically connected to the expanded wiring assembly, respectively, so that the at least one resistance-capacitance device and the photosensitive chip are conducted by means of the expanded wiring assembly, wherein the expanded wiring assembly includes an expanded wiring layer having a top surface and a bottom surface, and a conducting element, the at least one resistance-capacitance device is electrically connected to the bottom surface of the expanded wiring layer, and the conducting element extends between the bottom surface of the expanded wiring layer and the electric connection area of the photosensitive chip, so as to electrically connect the photosensitive chip to the expanded wiring layer by means of the conducting element, and a light hole is formed in the expanded wiring layer, and corresponds to at least the photosensitive area of the photosensitive chip, and the top surface of the expanded wiring layer forms a top surface of the photosensitive assembly for mounting an optical lens or a lens carrying element thereon; and a molded base, in which the photosensitive chip and the resistance-capacitance device are received respectively and on which the expanded wiring layer is supported.

In an example of the disclosure, the at least one resistance-capacitance device is located on two opposite sides of the photosensitive chip.

In an example of the disclosure, the photosensitive chip and the at least one resistance-capacitance device are located on the same side of the expanded wiring assembly.

In an example of the disclosure, the photosensitive assembly further includes: a light-transmitting element stacked on the photosensitive chip to cover at least the photosensitive area of the photosensitive chip.

In an example of the disclosure, the light-transmitting element is implemented as a filter element for filtering stray light from external light.

In an example of the disclosure, the light-transmitting element is implemented as a sacrificial element.

In an example of the disclosure, the light-transmitting element is implemented as a protective element.

In an example of the disclosure, a height dimension of the light-transmitting element is equal to a height dimension of the conducting element.

In an example of the disclosure, the expanded wiring layer includes an expanded circuit having a first electric connection end and a second electric connection end, the first electric connection end is electrically connected to the conducting element, and the second electric connection end extends laterally from the first electric connection end in a direction away from the conducting element and is electrically connected to the at least one resistance-capacitance device, and a size of the first electric connection end is smaller than that of the second electric connection end.

In an example of the disclosure, the molded base has a conducting element receiving hole extending between the electric connection area of the photosensitive chip and the bottom surface of the expanded wiring layer for receiving the conducting element.

In an example of the disclosure, the top surface of the expanded wiring layer is a plane.

In an example of the disclosure, the expanded wiring assembly further includes a second expanded wiring layer which is electrically connected to the expanded wiring layer and located on a bottom side of the photosensitive assembly, and the photosensitive assembly further includes a circuit external connection layer electrically connected to a bottom surface of the second expanded wiring layer.

In an example of the disclosure, the molded base is integrally combined with the photosensitive chip and the resistance-capacitance device.

In an example of the disclosure, the molded base is integrally combined with the conducting element.

According to another aspect of the disclosure, the disclosure also provides a camera module, including:

a photosensitive assembly; and an optical lens, held in a photosensitive path of the photosensitive assembly.

According to another aspect of the disclosure, the disclosure also provides a photosensitive assembly manufacturing method, including the following steps:

electrically connecting a conducting element to an electric connection area of a photosensitive chip, wherein the conducting element extends upwards from the electric connection area of the photosensitive chip in a direction away from the photosensitive chip;

forming a molded base to be integrally combined with the photosensitive chip, at least one resistance-capacitance device, and the conducting element;

forming an expanded wiring layer on the molded base to electrically connect the at least one resistance-capacitance device and the conducting element; and forming a light hole in the expanded wiring layer, wherein the light hole corresponds to at least the photosensitive area of the photosensitive chip.

In an example of the disclosure, before forming the molded base, the method further includes the following step:

stacking a light-transmitting element on the photosensitive chip to cover at least the photosensitive area of the photosensitive chip.

Further objects and advantages of the disclosure will become more fully apparent by understanding the following description and accompanying drawings.

These and other objects, features, and advantages of the disclosure will become more fully apparent from the following detailed description, the accompanying drawings, and the appended claims.

DETAILED DESCRIPTION OF THE INVENTION

Figure 1:
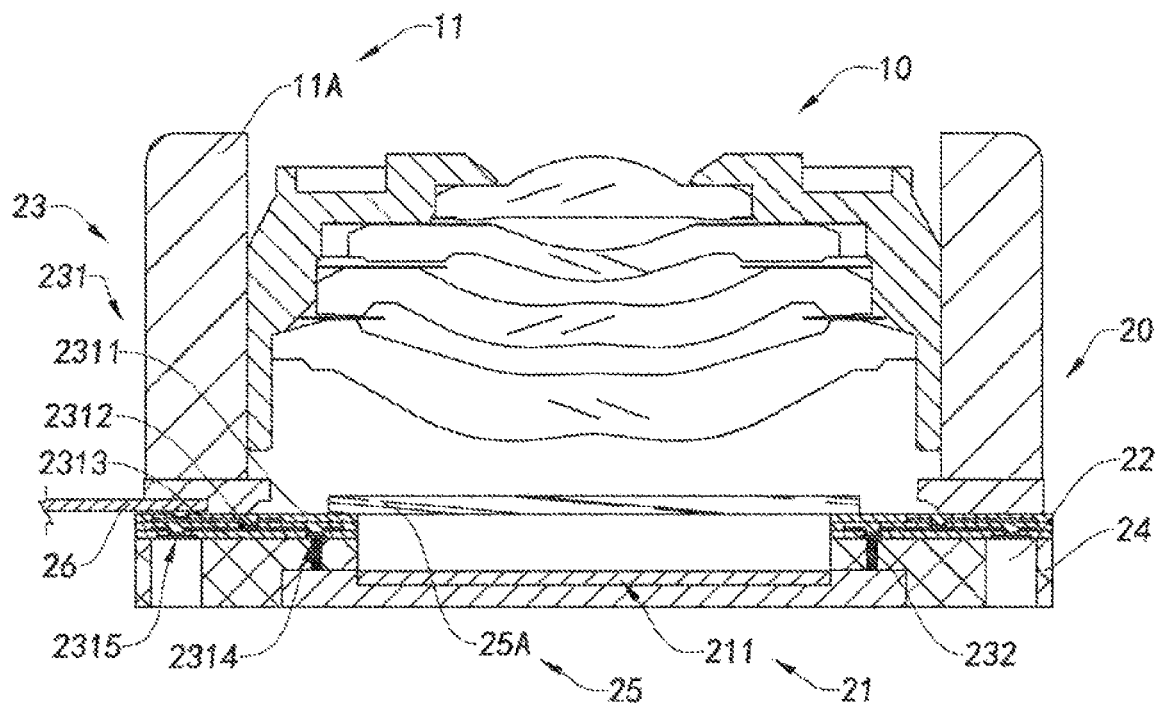
FIG. 1 is a schematic diagram of a camera module according to a preferred example of the disclosure.

The following description is used to disclose the disclosure to enable those skilled in the art to implement the disclosure. The preferred examples in the following description are by way of example only, and other obvious variations will occur to those skilled in the art. The basic principles of the disclosure as defined in the following description may be applied to other examples, modifications, improvements, equivalents, and other technical solutions without departing from the spirit and scope of the disclosure.

It should be understood by those skilled in the art that in the disclosure, the orientation or positional relationship indicated by terms "longitudinal", "transverse", "upper", "lower", "front", "back", "left", "right", "vertical", "horizontal", "top", "bottom", "inside", "outside", etc. is based on the orientation or positional relationship shown in the drawings, which is merely for the convenience of describing the disclosure and for the simplification of the description, and not to indicate or imply that the device or element referred to must have a specific orientation, or be constructed and operated in a specific orientation. Therefore, the above terms cannot be construed as limiting the disclosure.

It will be understood that the term "a/an" is construed as "at least one" or "one or more". That is, in an example, the number of an element may be one, and in another example, the number of elements may be plural. The term "a/an" cannot be construed as limiting the quantity.

As shown in FIG. 1, a camera module according to a preferred example of the disclosure is illustrated. The camera module may be applied to various consumer electronics and mobile computing devices, such as, but not limited to, smart phones, wearable devices, computer devices, televisions, cameras, and monitoring devices. As previously described, on one hand, the integration level of consumer electronics and mobile computing devices is increasingly high, and consumer electronics and mobile computing devices tend to be thinned and minimized, which means that an assembly space reserved for camera modules by electronics and mobile computing devices will continue to be compressed; on the other hand, consumer electronics and mobile computing devices are increasingly demanding on the performance of camera modules, which means that hardware dimensions of camera modules, especially of photosensitive chips, will need to be continuously increased (before an imaging technology has undergone a historic change). Obviously, this is an ever-present technical contradiction. That is to say, there is a constant need for a camera module capable of meeting demands of imaging performance upgrade and dimension miniaturization.

Those skilled in the art would know that the imaging performance of the camera module is affected by many factors, and the hardware configuration of a photosensitive chip (e.g. the number of pixels, the type of the photosensitive chip, etc.) and the optical system design of the camera module are most critical. More specifically, when the imaging performance of the camera module needs to be upgraded, it is a basic premise to improve the configuration of the photosensitive chip. Those skilled in the art would know that when the configuration of the photosensitive chip is upgraded, a circuit for conducting and controlling the photosensitive chip and other electronic devices of the camera module will become more complex. That is to say, when a photosensitive chip with a higher configuration is used, it is necessary to fully consider whether a subsequent packaging technology of the camera module can adapt to circuit design demands of the photosensitive chip with the higher configuration. In addition, the optical system design of the camera module should fully consider matching accuracy and calibration difficulty between various component parts of the camera module, that is to say, when the performance of the camera module needs to be upgraded, the subsequent packaging technology of the camera module should also be considered to ensure the matching accuracy of the component parts of the camera module.

As shown in FIG. 1, the camera module disclosed by the disclosure includes an optical lens 10 and a photosensitive assembly 20. The optical lens 10 is held in a photosensitive path of the photosensitive assembly 20 so as to form an optical system of the camera module. Light collected by the optical lens 10 can reach the photosensitive assembly 20 via the photosensitive path and perform an imaging reaction on the photosensitive assembly 20. It should be noted that, as shown in FIG. 1, in the preferred example of the disclosure, no circuit extension element such as a lead wire is introduced into the photosensitive assembly 20 to configure a circuit system of the photosensitive assembly 20. This technical feature is one of the core marks of the camera module provided by the disclosure. The reasons and technical principles behind will be specifically explained in the subsequent description.

Figure 2:
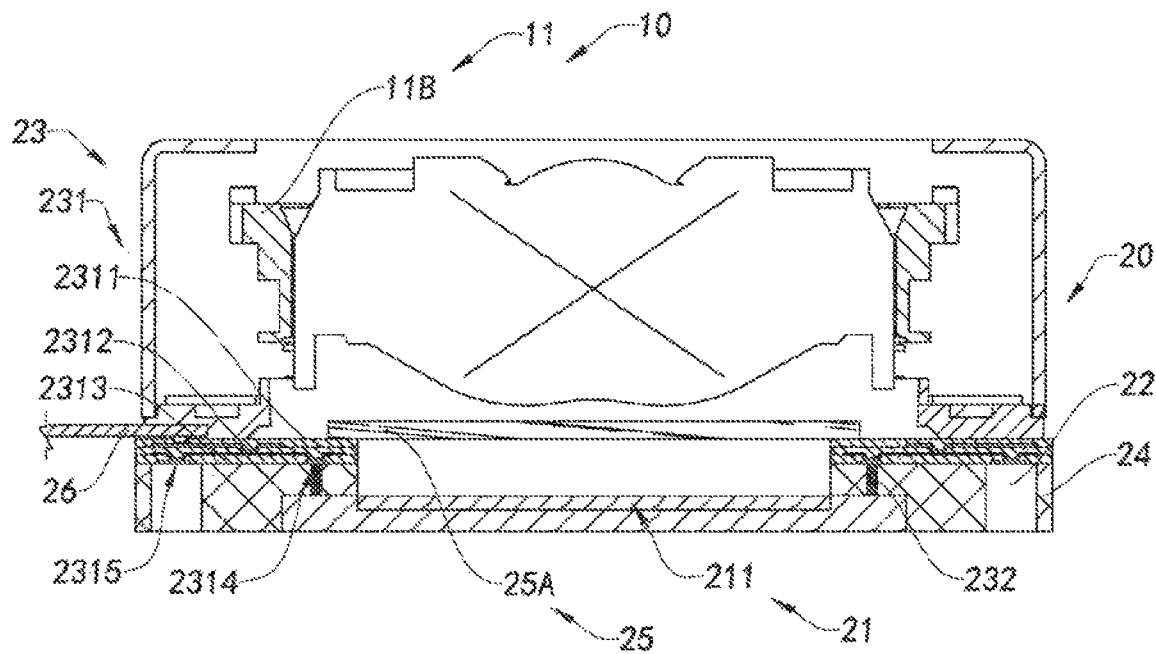
FIG. 2 is a schematic diagram of a camera module according to another preferred example of the disclosure.
Figure 3:
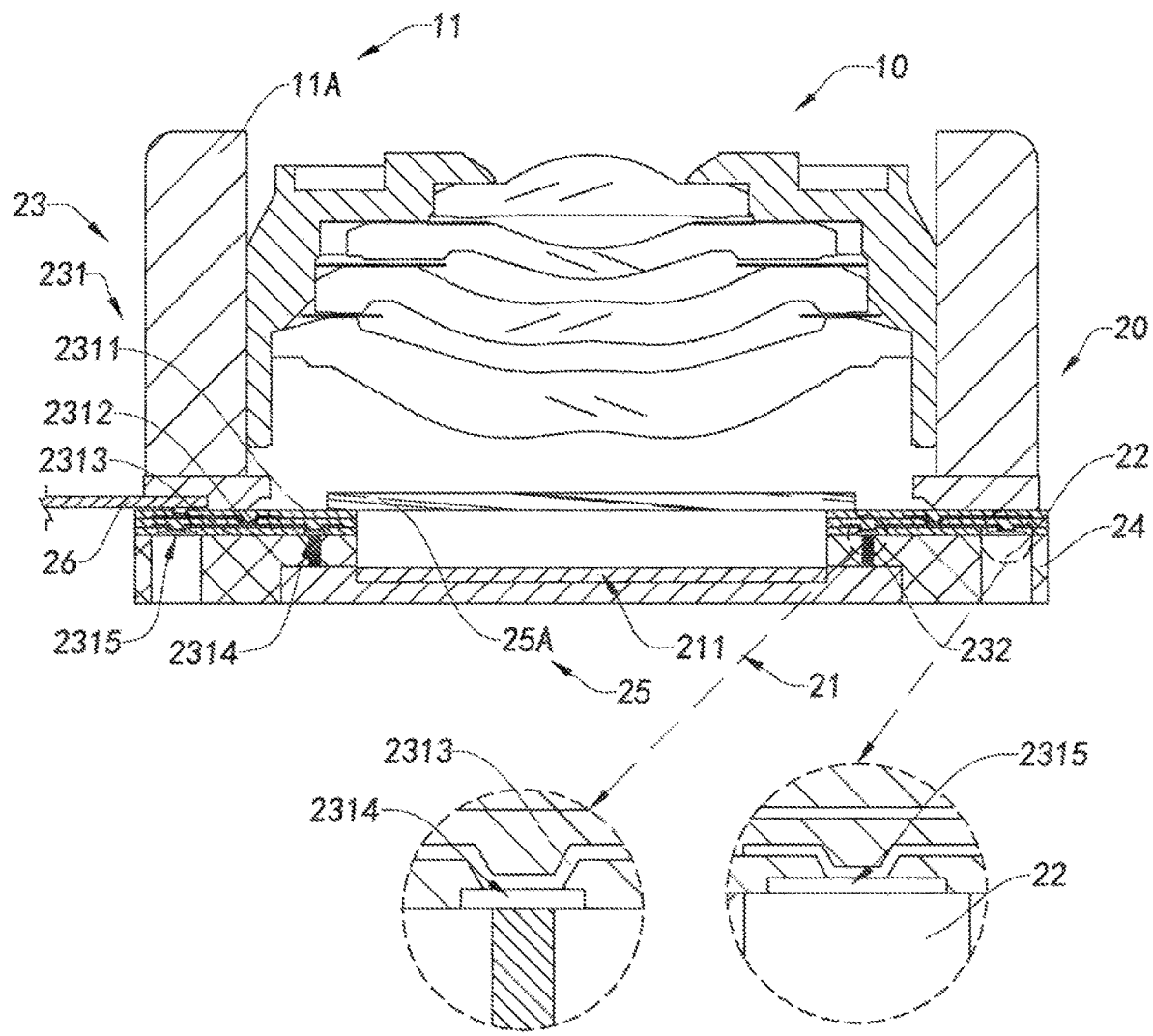
FIG. 3 is a schematic diagram of a camera module according to another preferred example of the disclosure.

Before proceeding with the detailed description of the photosensitive assembly 20, it should be readily apparent to those skilled in the art that in another example of the disclosure, the camera module further includes a lens carrying element 11. The lens carrying element 11 is mounted on a top side of the photosensitive assembly 20 for positioning and mounting the optical lens 10 so that the optical lens 10 is held in the photosensitive path of the photosensitive assembly 20 by means of the lens carrying element 11. As shown in FIG. 3, the lens carrying element 11 may be implemented as a static support element 11A. The optical lens 10 is fixedly limited to the top side of the photosensitive assembly 20 by means of the static support element 11A. That is to say, at this moment, the camera module is implemented as a fixed-focus camera module. A distance between the optical lens 10 and the photosensitive assembly 20 is kept constant. As shown in FIG. 2, the lens carrying element 11 is implemented as a drive element 11B, such as a voice coil motor and a stepping motor. The drive element 11B is mounted on the top side of the photosensitive assembly 20 for mounting the optical lens 10 and driving the optical lens 10 to move, so as to change the distance between the optical lens 10 and the photosensitive assembly 20. That is to say, at this moment, the camera module is constructed as a dynamic focus camera module. The distance between the optical lens 10 and the photosensitive assembly 20 is adjustable. In addition, in the disclosure, the type of the optical lens 10 may be adjusted according to the demands of the camera module. For example, the optical lens 10 may be implemented as an integrated optical lens, a split optical lens, a bare lens, or an optical lens including a lens barrel, etc. which is not limited by the disclosure.

As shown in FIG. 1, in the preferred example of the disclosure, the photosensitive assembly 20 includes a photosensitive chip 21, at least one resistance-capacitance device 22, an expanded wiring assembly 23, and a molded base 24. The photosensitive chip 21 and the at least one resistance-capacitance device 22 are electrically connected to the expanded wiring assembly 23, respectively, so as to configure the circuit design of the photosensitive assembly 20 and the camera module by means of the expanded wiring assembly 23. The molded base 24 is integrally combined with the photosensitive chip 21, the at least one resistance-capacitance device 22 and the expanded wiring assembly 23 so that the photosensitive assembly 20 has a modular structure. Those skilled in the art would know that existing camera modules, including but not limited to a camera module based on a COB packaging technology, a camera module based on an FC packaging technology, a camera module based on a Molding On Board (MOB) packaging technology, and a camera module based on a Molding On Chip (MOC) packaging technology, which all adopt a circuit board and a circuit extension element such as a lead wire to configure circuit systems of the photosensitive assembly and the camera module. However, this circuit configuration manner has certain drawbacks.

First, although a circuit board technology used for the camera module (e.g. soft and hard bonding boards, hard boards, flexible circuit boards, etc.) are well developed, a height dimension of the circuit board occupies a considerable proportion with respect to an overall height dimension of the camera module. That is to say, although the circuit board can stably configure the circuit design of the camera module, it does not have any advantage in terms of a physical dimension of the camera module.

Second, when the performance of the photosensitive chip is improved, e.g. a high-pixel photosensitive chip is used, the number of connection pads arranged on the photosensitive chip and used for conducting the photosensitive chip and other electronic components will continue to increase. At this moment, laying a lead wire between the photosensitive chip and other electronic components causes a great trouble. For example, the lead wires are intertwined with each other, a distribution space of the lead wires is insufficient, etc.

Third, when the photosensitive assembly and other components of the camera module are subsequently packaged (e.g. a lens holder, a molded base, etc.), the laid lead wires will cause a series of undesirable reactions. For example, in the camera module using the COB packaging technology, when a lens holder is mounted, a sufficient safety space needs to be reserved between the lens holder and the lead wire to prevent the lead wire from being loosened or even detached due to the contact therebetween, which results in the increase of the overall height dimension of the photosensitive assembly and the camera module. For example, in the camera module using the MOC packaging technology, unnecessary contact between a molding die and the lead wire after mold clamping should be avoided when forming a molded base. Of course, those skilled in the art would know that there are many problems associated with such lead wires. For example, electromagnetic interference between the lead wires results in the presence of noise in imaging, etc. which is not described in detail herein.

Fourth, when a lead wire and a circuit board are used to configure the circuit system of the camera module, a lens holding member is usually mounted or formed on the circuit board for mounting an optical lens or a lens carrying element thereon. Those skilled in the art would know that the matching accuracy between various components in the field of camera modules affects the final imaging performance of the camera modules. In an existing camera module, a finally formed or mounted lens holding member is usually mounted and calibrated with the circuit board as a reference plane. That is to say, the matching accuracy between the optical lens and the photosensitive chip of the existing camera module is affected by at least the following factors: first, the accuracy with which the lens holding member is formed or mounted on the circuit board; second, the flatness of a surface of the lens holding member; and third, the accuracy with which the optical lens or lens carrying element is mounted on the lens holding member. With regard to the existing camera module, it is difficult to ensure both the first influence factor and the second influence factor, resulting in that the matching accuracy of various components of the camera module and the accuracy of the optical system affected thereby are difficult to meet preset requirements finally.

Accordingly, in the disclosure, the photosensitive assembly 20 configures a circuit design between the photosensitive chip 21 and the at least one resistance-capacitance device 22 by using the expanded wiring assembly 23 in such a manner as to replace a circuit configuration manner of an existing camera module with a circuit board and a lead wire. Thus, a technical problem directly or indirectly caused by the circuit board and the lead wire may be directly avoided.

Figure 4:
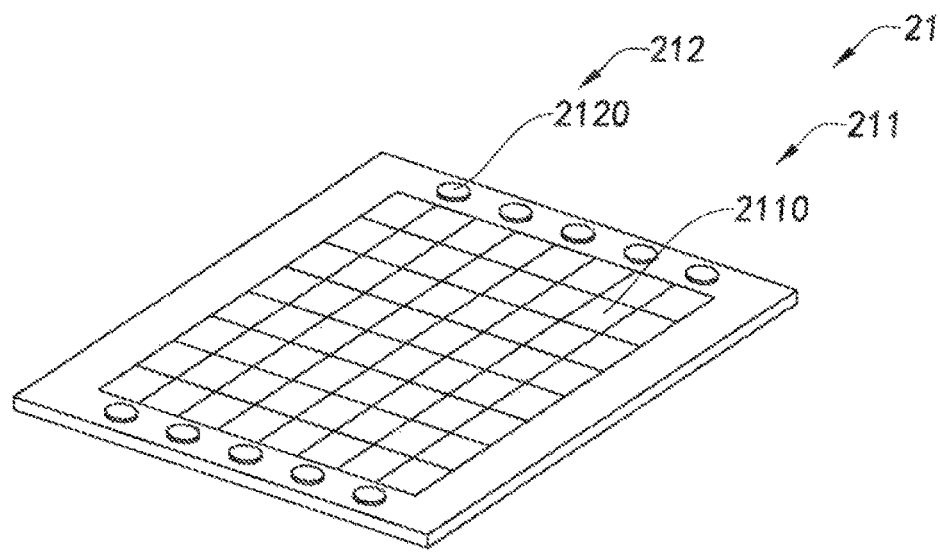
FIG. 4 is a schematic diagram of a photosensitive chip according to a preferred example of the disclosure.

More specifically, as shown in FIG. 4, in the preferred example of the disclosure, the photosensitive chip 21 includes a photosensitive area 211 and an electric connection area 212 located around the photosensitive area 211. The photosensitive area 211 includes a series of pixels 2110 (i.e. a photoelectric sensor) for receiving external light with imaging information about a measured object and performing a photoelectric reaction. The electric connection area 212 includes a series of electric connection ends 2120 for electrically connecting the photosensitive chip 21 to other electronic components. Those skilled in the art would know that when the performance of the photosensitive chip 21 needs to be improved, it is often accompanied by the increase of the number of the electric connection ends 2120. The existing circuit configuration manner based on the circuit board and the lead wire will be increasingly difficult to adapt to the circuit configuration requirements of the photosensitive chip 21, because the number of the lead wires may be increased when the number of the electric connection ends 2120 is increased. It is obviously difficult to adapt to the demand for the insufficient distribution space. Accordingly, in the disclosure, the photosensitive chip 21 is circuit-extended by the expanded wiring assembly 23. An expanded circuit of the expanded wiring assembly 23 is embedded in the expanded wiring assembly 23 and the molded base 24 in a pre-buried manner. Thus, the circuit expansion manner of the expanded wiring assembly 23 can be well adapted to final forming dimension requirements of the photosensitive assembly 20 regardless of the number of the electric connection ends 2120 of the photosensitive chip 21. That is to say, the manner of configuring a circuit connection between the photosensitive assembly 20 and the camera module by using the expanded wiring assembly creates a larger operable space for improving the imaging performance of the camera module, and facilitates the camera module to adapt to the current trend of thinness and minimization of electronic devices.

Further, when the photosensitive chip 21 is circuit-expanded by using the expanded wiring assembly 23, the at least one resistance-capacitance device 22 can be conducted with the photosensitive chip 21 only by being electrically connected to the expanded wiring assembly 23. Those skilled in the art would know that in an existing camera module of the circuit configuration based on a circuit board and a lead wire, a resistance-capacitance device needs to be mounted to a preset position of the circuit board by using, for example, a Surface Mounting Technology (SMT) and is electrically connected to a photosensitive chip by using the lead wire. That is to say, in the existing camera module, a mounting position of the resistance-capacitance device is relatively fixed and the layout needs to be re-performed corresponding to different camera modules. In addition, when the resistance-capacitance device is mounted by using the SMT, it is inevitable that many adverse effects are generated due to the defects of the SMT, such as tombstoning. However, in the disclosure, the photosensitive assembly 20 is electrically connected to the at least one resistance-capacitance device 22 by using the expanded wiring assembly 23. In this way, on one hand, a packaging position of the at least one resistance-capacitance device 22 may be freely adjusted (only the layout of the expanded circuit of the expanded wiring assembly 23 needs to be changed), and on the other hand, since the circuit board and the lead wire are not needed, the existing SMT may be eliminated to further reduce the cost of the camera module.

In particular, as shown in FIG. 1, in the preferred example of the disclosure, the at least one resistance-capacitance device 22 and the photosensitive chip 21 are electrically connected to the expanded wiring assembly 23 simultaneously, and are located on the same side of the expanded wiring assembly 23. In this way, the at least one resistance-capacitance device 22 and the photosensitive assembly 20 occupy a small proportion of an overall height of the camera module in a longitudinal direction, so that the finally formed photosensitive assembly 20 and the camera module have a relatively small height dimension. In addition, the at least one resistance-capacitance device 22 is preferably arranged on two opposite sides of the photosensitive chip 21. In this way, the configuration of the expanded wiring assembly 23 is facilitated by this layout, and a dimension in a length-width direction of the finally formed photosensitive assembly 20 is appropriate. Of course, in another example of the disclosure, the at least one resistance-capacitance device 22 and the photosensitive chip 21 may be arranged in different ways, which is not limited by the disclosure.

Furthermore, in the preferred example of the disclosure, the expanded wiring assembly 23 includes an expanded wiring layer 231 and a conducting element 232. The expanded wiring layer 231 has a top surface 2311 and a bottom surface 2312. The at least one resistance-capacitance device 22 is electrically connected to the bottom surface 2312 of the expanded wiring layer 231. The conducting element 232 extends between the bottom surface 2311 of the expanded wiring layer 231 and the electric connection area 212 of the photosensitive chip 21 so that the photosensitive chip 21 is electrically connected to the expanded wiring layer 231 by means of the conducting element 232. It should be noted that the photosensitive chip 21 is electrically connected to the expanded wiring layer 231, and the at least one resistance-capacitance device 22 is electrically connected to the expanded wiring layer 231, so that the expanded wiring layer 231 builds an object similar to a conduction bridge between the photosensitive chip 21 and the at least one resistance-capacitance device 22 for conducting the photosensitive chip 21 and the at least one resistance-capacitance device 22. It should be noted that when a circuit system between the photosensitive chip 21 and the at least one resistance-capacitance device 22 is configured by using the expanded wiring layer 231 and the conducting element 232, it should be fully considered that the photosensitive area 211 of the photosensitive chip 21 is capable of receiving external light. Accordingly, in the preferred example of the disclosure, the conducting element 232 extends longitudinally upwards from the electric connection area 212 of the photosensitive chip 21. The electric connection area 212 of the photosensitive chip 21 is located around the photosensitive area 211 of the photosensitive chip 21. That is to say, the conducting element 232 is arranged at a position that has no influence on receiving of external light by the photosensitive chip 21. As shown in FIG. 1, the expanded wiring layer 231 is electrically connected to the conducting element 232 and extends laterally above the photosensitive chip 21. Therefore, in the preferred example of the disclosure, the expanded wiring layer 231 needs to form a light hole 230 corresponding to at least the photosensitive area 211 of the photosensitive chip 21 so that external light can reach at least the photosensitive area 211 of the photosensitive chip 21 via a photosensitive path defined by the optical lens 10, the light hole 230 and the photosensitive chip 21, and can perform an imaging reaction.

It should be appreciated that when designing an expanded circuit 2313 of the expanded wiring layer 231, it is considered not only that the expanded circuit 2313 can electrically connect the photosensitive chip 21 and the at least one resistance-capacitance device 22, but also that the light hole 230 is avoided. Accordingly, as shown in FIG. 3, in the preferred example of the disclosure, the expanded wiring layer 231 includes an expanded circuit 2313. The expanded circuit 2313 has a first electric connection end 2314 and a second electric connection end 2315. The first electric connection end 2314 is electrically connected to the conducting element 232. The second electric connection end 2315 extends laterally from the first electric connection end 2314 in a direction away from the conducting element 232 and is electrically connected to the at least one resistance-capacitance device 22. The light hole 230 is formed between the conducting elements 232. It is worth mentioning that a size of the first electric connection end 2314 of the expanded circuit 2313 is preferably smaller than that of the second electric connection end 2315, because suitably increasing the size of the second electric connection end 2315 of the expanded circuit 2313 facilitates alignment and electric connection of the at least one resistance-capacitance device 22 therewith.

Further, in the disclosure, the expanded wiring layer 231 of the expanded wiring assembly 23 may be formed at a corresponding position of the photosensitive assembly 20 by a rewiring technique. It should be understood by those skilled in the art that the rewiring technique is an important technology for a chip packaging process, including the following basic steps: copper sputtering, photoresist coating, exposure/development, copper grafting, separation, copper acid etching, application of dielectric coatings, etc. to expand the layout of input/output ports of a chip circuit. However, since the purpose of the expanded wiring assembly 23 is to package the photosensitive assembly 20 and configure a circuit structure of the photosensitive assembly 20, when the expanded wiring layer 231 is formed by specifically using the rewiring technique, the technical features in terms of the structure of the expanded wiring layer 231 should be fully considered, and the rewiring technique should be adaptively adjusted so as to adapt to packaging demands of the camera module and the photosensitive assembly 20. Of course, it should be appreciated by those skilled in the art that in the disclosure, the expanded wiring layer 231 of the expanded wiring assembly 23 may be implemented by using other technical solutions, and it is only necessary that the finally formed expanded wiring layer can realize the circuit connection between the photosensitive chip 21 and the at least one resistance-capacitance device 22 and be used in packaging the photosensitive chip 21 and the at least one resistance-capacitance device 22.

It should be noted that in the preferred example of the disclosure, the top surface 2311 of the expanded wiring layer 231 of the expanded wiring assembly 23 forms a top surface of the photosensitive assembly 20 for mounting the optical lens 10 or the lens carrying element 11 of the camera module. Those skilled in the art would know that the expanded wiring layer 231 formed by means of the rewiring technique has a relatively high flatness. That is to say, the top surface 2311 of the expanded wiring layer 231 has a relatively high flatness and the top surface of the photosensitive assembly 20 has a relatively high flatness. Based on this feature, the top surface 2311 of the expanded wiring layer 231 is naturally suitable as a mounting base surface of the camera module for calibrating and mounting the optical lens 10 or the lens carrying element 11 thereon. That is to say, with the expanded wiring assembly 23, the matching accuracy between various components of the camera module may be effectively improved, so as to facilitate improving the optical system erection accuracy of the camera module to improve the imaging performance of the camera module.

In addition, those skilled in the art would know that when the camera module is packaged, it is necessary to ensure that an optical back focal dimension of the camera module meets design requirements of the optical system, i.e., to ensure that a distance between the optical lens 10 and the photosensitive chip 21 meets optical back focal dimension demands.

As can be seen from the visual effect in FIG. 1, when the optical lens 10 is mounted on the top surface 2311 of the expanded wiring layer 231 (or by means of the lens carrying element 11), the conducting element 232 extending between the bottom surface 2312 of the expanded wiring layer 231 and the electric connection area 212 of the photosensitive chip 21 may control a distance between the optical lens 10 and the photosensitive chip 21, i.e. an optical back focal length of the camera module. More specifically, when the conducting element 232 is extended, the photosensitive chip 21 moves downwards relative to the top surface of the photosensitive assembly 20 to increase the distance between the photosensitive chip 21 and the optical lens 10, i.e., the optical back focal length of the camera module is increased. When the conducting element 232 is shortened, the photosensitive chip 21 moves upwards relative to the top surface of the photosensitive assembly 20 to reduce the distance between the photosensitive chip 21 and the optical lens 10, i.e. the optical back focal length of the camera module is reduced.

It is worth mentioning that when a molding process is performed to form the molded base 24 for packaging the photosensitive assembly 20, it should be ensured that the photosensitive chip 21, in particular at least the photosensitive area 211 of the photosensitive chip 21, is not polluted. Accordingly, in the preferred example of the disclosure, the photosensitive assembly 20 further includes a light-transmitting element 25. The light-transmitting element 25 is stacked on the photosensitive chip 21 and covers at least the photosensitive area 211 of the photosensitive chip 21, so that the light-transmitting element 25 can effectively prevent molding material from polluting at least the photosensitive area 211 of the photosensitive chip 21 during the formation of the molded base 24. The light-transmitting element 25 may be mounted to the molded base 24 and cover the photosensitive chip 21 after the molded base 24 is formed. In other examples of the disclosure, with reference to FIGS. 5 and 6, the light-transmitting element 25 may also be superposed on the photosensitive chip 21 prior to forming the molded base 24, the light-transmitting element 25 may be laminated to the photosensitive chip 21, and then the molded base 24 may be formed by molding. The light-transmitting element 25 may be fixed to the photosensitive chip 21 by means of gluing, etc. For example, a small amount of glue may be attached to a connection periphery of the light-transmitting element 25 and the photosensitive chip 21. This description is given for the sake of example only, without limiting the disclosure.

Figure 5:
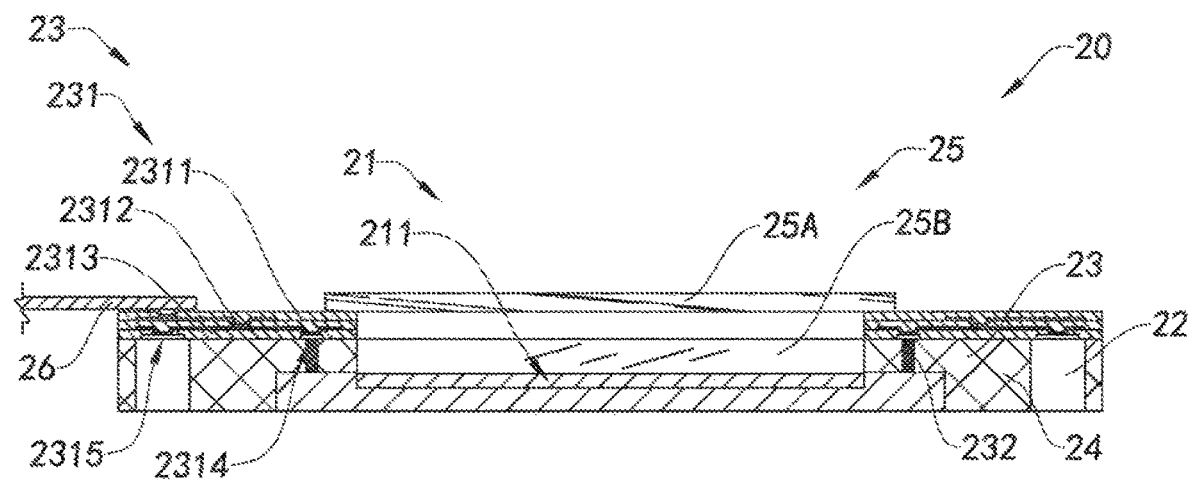
FIG. 5 is a schematic diagram of a photosensitive assembly according to another preferred example of the disclosure.
Figure 6:
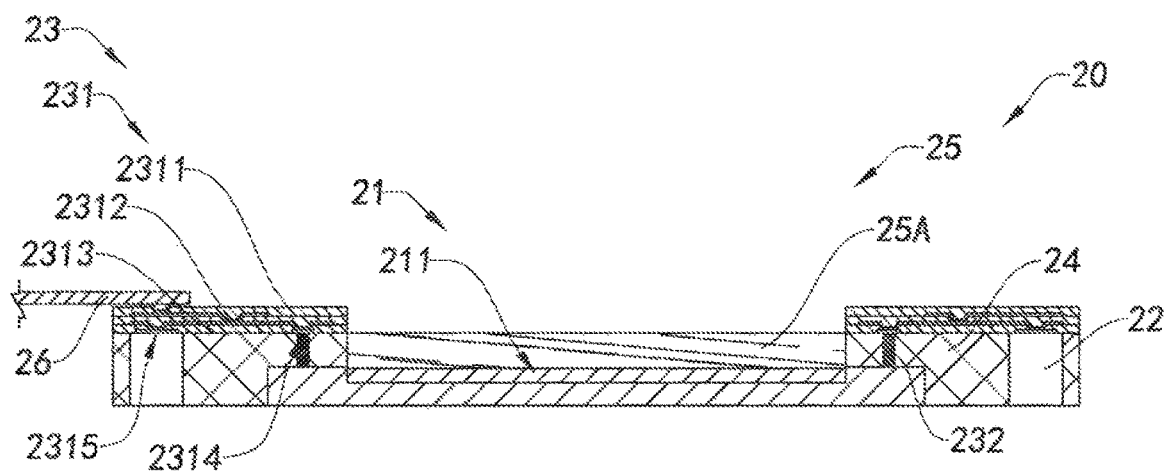
FIG. 6 is a schematic diagram of a photosensitive assembly according to another preferred example of the disclosure.

In particular, in some examples of the disclosure, with reference to, e.g., FIG. 5 or FIG. 6, a height of the light-transmitting element 25 is equal to a thickness of the conducting element 232, so that when the conducting element 232 is exposed to the molded base 24 by grinding or other processes, the light-transmitting element 25 is also exposed to the molded base 24. Further, after the expanded wiring layer 231 forms the light hole 230, light collected by the optical lens 10 can reach the photosensitive area 211 of the photosensitive chip 21 along the light hole 230 and the light-transmitting element 25.

It is worth mentioning that in an example of the disclosure, with reference to FIG. 6, the light-transmitting element 25 may be implemented as a filter element 25A for filtering stray light in the light collected by the optical lens 10 so that a final imaging effect is close to a human visual effect. The filter element 25A includes, but is not limited to, blue glass, an infrared cut-off filter element, a full-spectrum filter, etc. It should be appreciated that when the filter element 25A is mounted to the photosensitive chip 21 in a stacked manner, the filter element 25A needs to be relatively small in dimension to reduce the cost of the filter element 25A as compared to a technical solution in which a filter element is mounted to a lens support in an existing camera module. Of course, in another example of the disclosure, the light-transmitting element 25 may be configured to protect the photosensitive area 211 of the photosensitive chip 21 from being polluted, i.e. the light-transmitting element 25 may be implemented as a protective element 25B made of glass or any other light-transmitting material.

In addition, in another example of the disclosure, the light-transmitting element 25 may be implemented as a sacrificial element 25C which is removed by using a related process after the photosensitive assembly 20 is formed. Those skilled in the art would know that this technology is a surface sacrificial layer technology. The surface sacrificial layer technology refers to a technology in which, in the process of forming a cavity of a micro-mechanical structure or a movable micro-structure, various required special structures are deposited on an underlying thin film by using a structural material, the thin film is then etched away by using a chemical etching agent without damaging the micro-structure, and then an overlying thin film structure (cavity or micro-structure) is obtained. Since the removed underlying thin film only functions as a separation layer, it is called a sacrificial layer (having a thickness of about 1-2 μm). It is worth mentioning that the sacrificial element 25C is typically made of a material including silicon oxide, polycrystalline silicon, photoresist, etc.

It is worth mentioning that with reference to FIG. 5, when the light-transmitting element is implemented as a simple protective element 25B or a sacrificial element 25C, the photosensitive assembly further includes a filter element 25A. The filter element 25A is held in the photosensitive path of the photosensitive assembly 20 for filtering stray light in the light collected by the optical lens 10 so that a final imaging effect is close to a human visual effect.

In particular, in the preferred example of the disclosure, the filter element 25A may be held on the top surface of the photosensitive assembly 20 to correspond to at least the photosensitive area 211 of the photosensitive chip 21. As previously described, the top surface 2311 of the expanded wiring layer 231 of the expanded wiring assembly 23 forms the top surface of the photosensitive assembly 20 and has a relatively high flatness. Thus, when the filter element 25A is mounted to the top surface of the photosensitive assembly 20, the filter element 25A is more uniformly stressed and less susceptible to damage.

Figure 7:
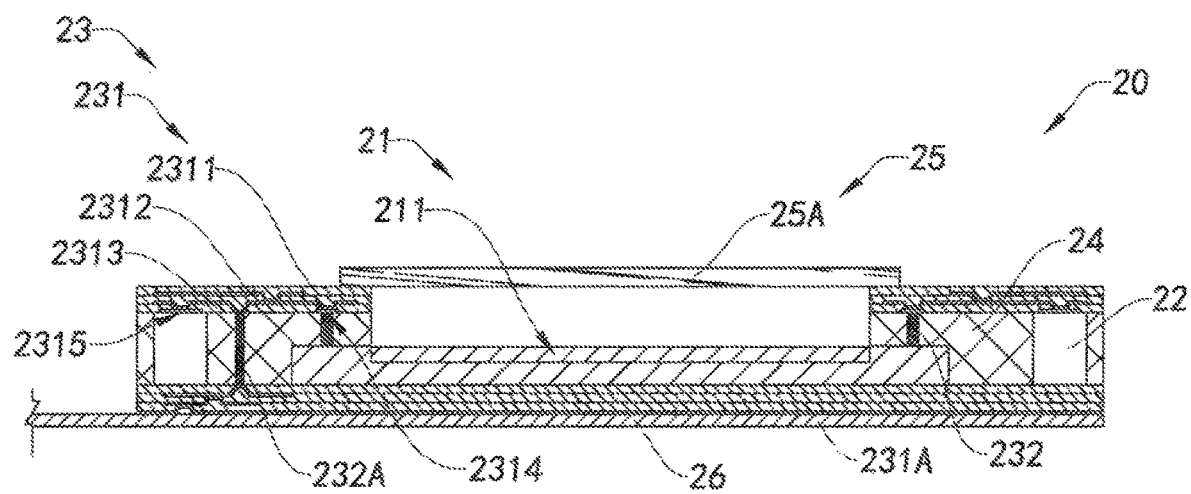
FIG. 7 is a schematic diagram of a photosensitive assembly according to another preferred example of the disclosure.

Further, in the preferred example of the disclosure, with reference to FIG. 7, the photosensitive assembly 20 further includes a circuit external connection layer 26. The circuit external connection layer 26 is electrically connected to the photosensitive assembly 20 for conducting the camera module to other electronic devices. In particular, in the disclosure, the circuit external connection layer 26 may be configured to be electrically connected to the top surface 2311 of the expanded wiring layer 231. Of course, the circuit external connection layer 26 is preferably arranged on a bottom side of the photosensitive assembly 20 in order to realize this technical solution. The expanded wiring assembly 23 further includes a second expanded wiring layer 231A. The second expanded wiring layer 231A is electrically connected to the expanded wiring layer 231 through a second conducting element 232A and located on the bottom side of the photosensitive assembly 20. Accordingly, by electrically connecting only the circuit external connection layer 26 to a bottom surface of the second expanded wiring layer 231A, the circuit external connection layer 26 can be arranged on the bottom side of the photosensitive assembly 20.

It is worth mentioning that the circuit external connection layer 26 may be a rigid circuit board or a flexible circuit board. For example, the circuit external connection layer 26 may be a flexible circuit board which is electrically connected to the top surface 2311 of the expanded wiring layer 231 or the bottom surface of the second expanded wiring layer 231A by means of soldering or conductive adhesive connection.

Figure 8:
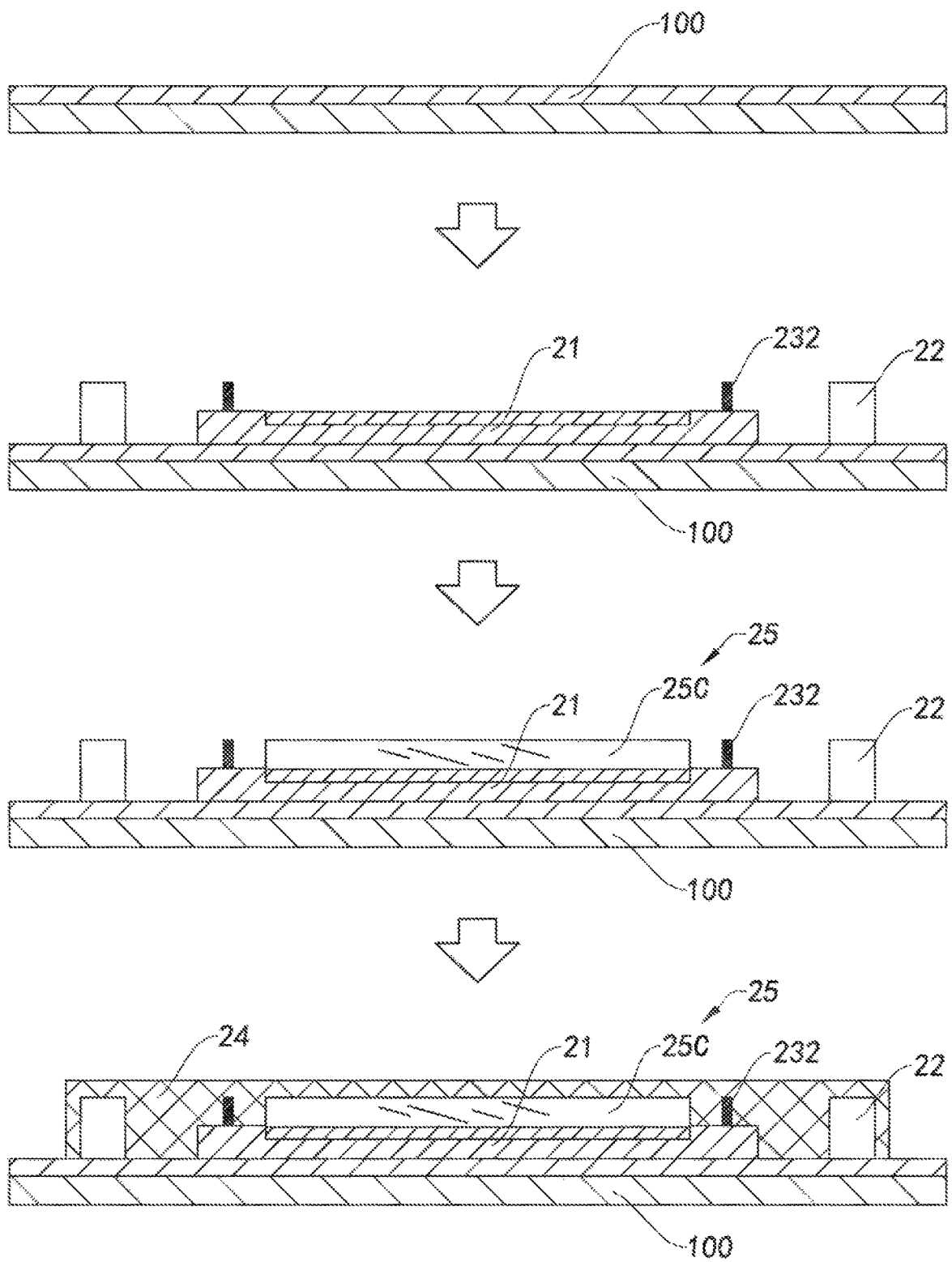
FIG. 8 is a schematic diagram of a manufacturing process of a photosensitive assembly according to a preferred example of the disclosure.
Figure 9:
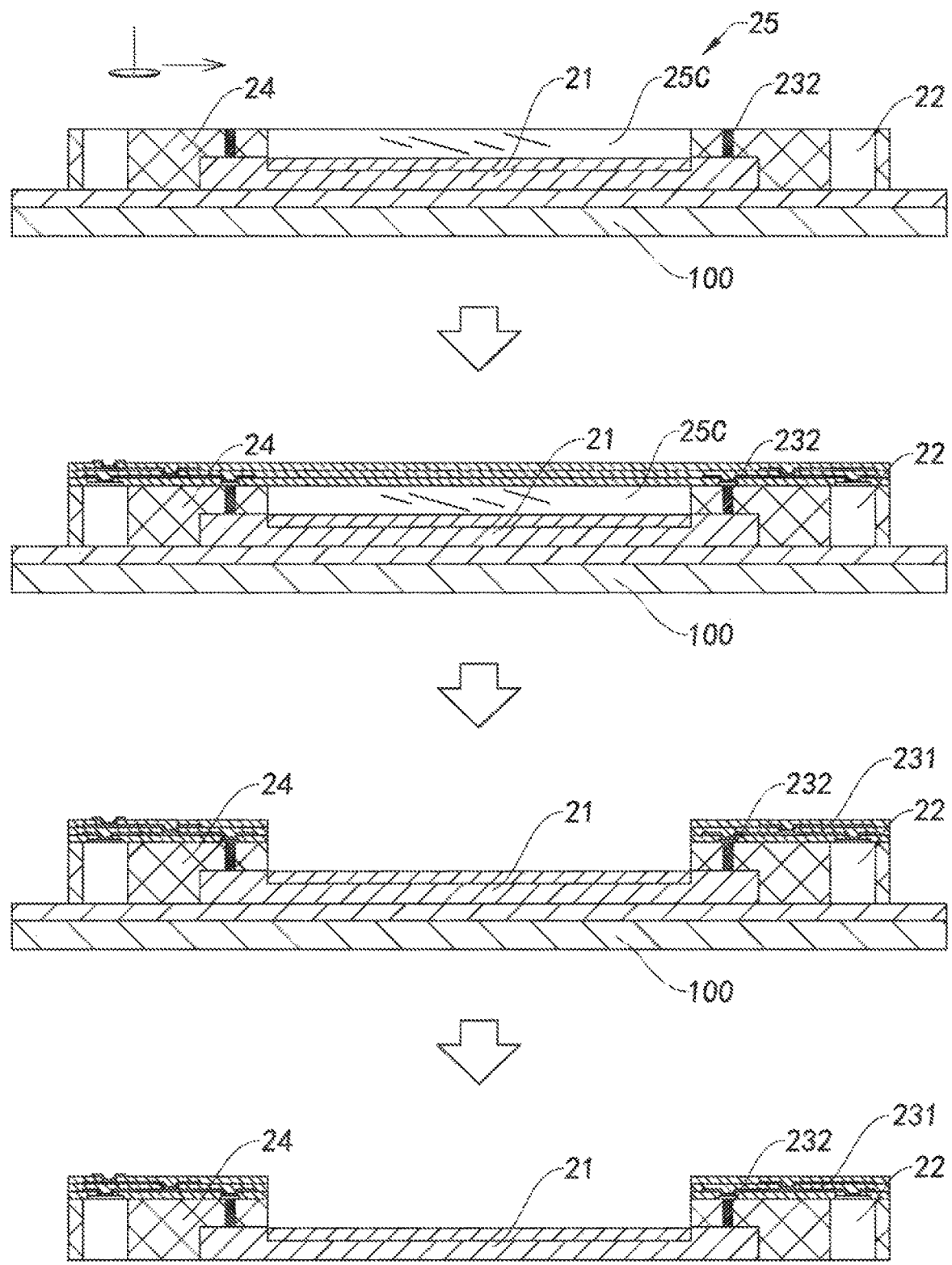
FIG. 9 is a schematic diagram of the manufacturing process of the photosensitive assembly according to the above preferred example of the disclosure.

FIGS. 8 to 9 show a schematic diagram of a manufacturing process of the photosensitive assembly 20 disclosed according to a preferred example and modified examples of the disclosure. When the photosensitive assembly 20 is manufactured, a manufacturing carrier 100 is firstly provided to provide a carrying attachment position for subsequent manufacturing of the photosensitive assembly 20.

Further, a conducting element 232 is electrically connected to an electric connection area 212 of a photosensitive chip 21. The conducting element 232 extends upwards from the electric connection area 212 of the photosensitive chip 21 in a direction away from the photosensitive chip 21. It should be noted that in order to prevent the photosensitive area 211 of the photosensitive chip 21 from being polluted during subsequent manufacturing, a light-transmitting element 25 may optionally be stacked on the photosensitive chip 21. The light-transmitting element 25 covers at least the photosensitive area 211 of the photosensitive chip 21. As previously described, the light-transmitting element 25 may be implemented as a filter element 25A, a protective element 25B, or a sacrificial element 25C, corresponding to changes of different light-transmitting elements 25 during subsequent manufacturing. In particular, in the disclosure, a height of the light-transmitting element 25 is equal to that of the conducting element 232.

Further, a molded base 24 is formed to be integrally combined with the photosensitive chip 21, at least one resistance-capacitance device 22, and the conducting element 232. It should be appreciated that in the disclosure, the at least one resistance-capacitance device 22 is preferably arranged on two opposite sides of the photosensitive chip 21 to facilitate subsequent configuration of the expanded circuit 2313 of the expanded wiring layer 231.

It should be understood that the photosensitive chip 21, the resistance-capacitance device 22, and the conducting element 232 are received in the molded base 24 respectively. The photosensitive chip 21, the resistance-capacitance device 22, and the conducting element 232 may be mounted to the molded base 24 in the above integral combination manner or after the molded base 24 is formed. For example, mounting holes are provided for the molded base 24.

Optionally, the top surface of the resistance-capacitance device 22 and the top surface of the conducting element 232 are flush to facilitate that the resistance-capacitance device 22 and the conducting element 232 may be simultaneously exposed for connection to the expanded wiring layer 231 in a subsequent step. Alternatively, when the top surface of the resistance-capacitance device 22 is lower than the conducting element 232, the resistance-capacitance device 22 and the expanded wiring layer 231 may be conducted through an additional conducting element. Alternatively, the resistance-capacitance device 22 may be conducted to a second expanded wiring layer 231A through an additional conducting element.

Further, an expanded wiring layer 231 is formed on the molded base 24 to electrically connect the at least one resistance-capacitance device 22 and the conducting element 232. It should be noted that prior to the step of forming the expanded wiring layer 231, a part of the molded base 24 is removed by, for example, grinding, cutting, etc. to expose the conducting element 232, a conductive end of the resistance-capacitance device 22, and the light-transmitting element 25 to the molded base 24.

Further, a light hole 230 is formed in the expanded wiring layer 231 by, for example, exposure, acid etching, etc. The light hole 230 corresponds to at least the photosensitive area 211 of the photosensitive chip 21.

It is worth mentioning that when the light-transmitting element 25 is implemented as a sacrificial element 25C, the manufacturing process of the photosensitive assembly 20 may further include an operation of removing the sacrificial element 25C by, for example, exposure, acid etching, etc.

Further, the circuit external connection layer 26 is electrically connected to the top surface 2311 of the expanded wiring layer 231.

Further, the semi-finished photosensitive assembly 20 is tested.

Of course, in another example of the disclosure, the manufacturing process of the photosensitive assembly 20 further includes the following steps.

A second expanded wiring layer 231A is formed on the bottom side of the photosensitive assembly 20. The second expanded wiring layer 231A is electrically connected to the expanded wiring layer 231 by means of a second conducting element 232A. It should be appreciated that the second conducting element 232A may optionally be pre-buried in the molded base 24 in the step of forming the molded base 24 so that the second expanded wiring layer 231A can be electrically connected to the expanded wiring layer 231 by means of the second conducting element 232A after the second expanded wiring layer 231A is formed. Of course, it would have readily occurred to those skilled in the art that in the step of manufacturing the molded base 24, a conducting element mounting hole 2320 may be selected to be reserved in the molded base 24 for mounting the second conducting element 232A so that the second expanded wiring layer 231A can be electrically connected to the expanded wiring layer 231 by means of the second conducting element 232A after the second expanded wiring layer 231A is formed.

Figure 10:
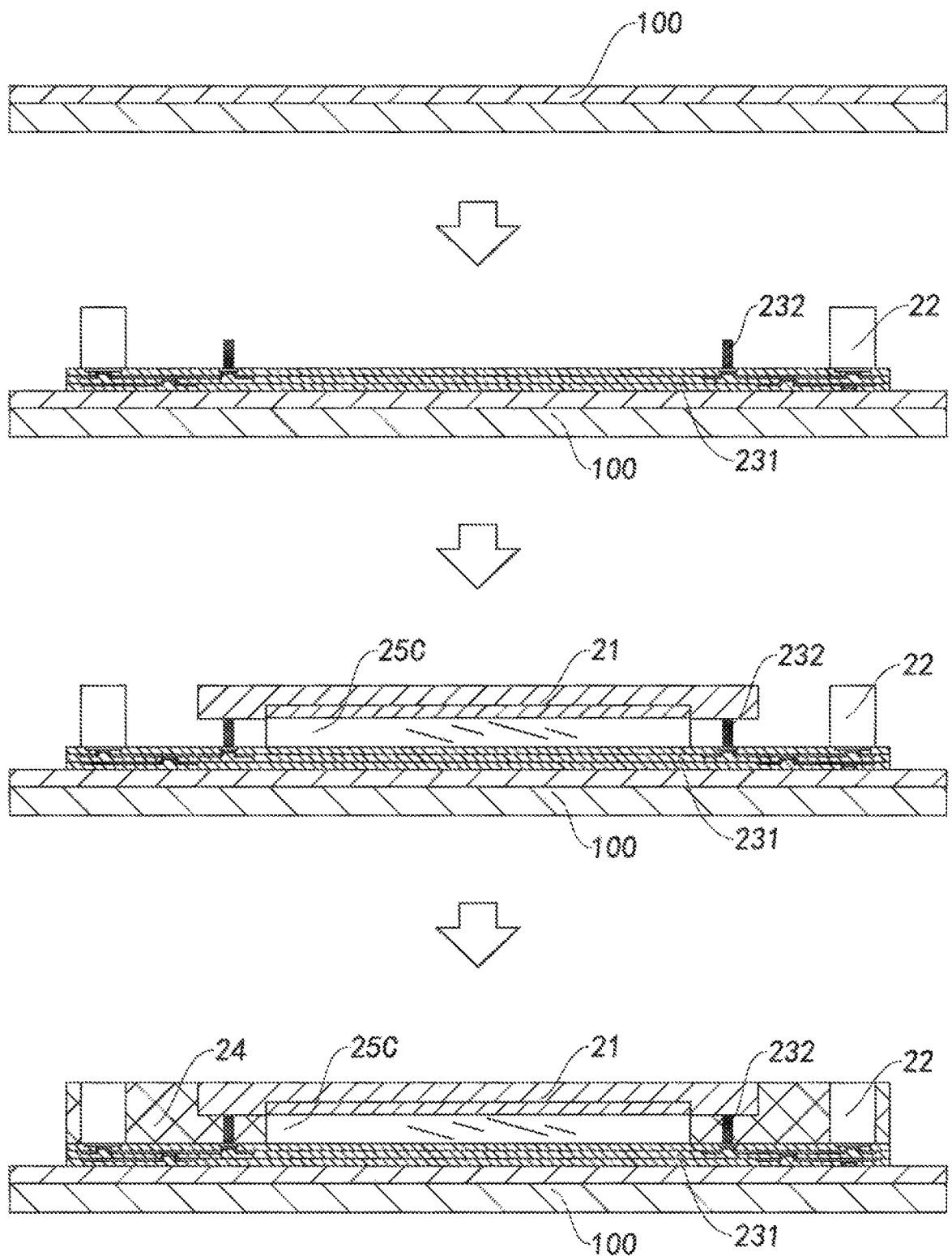
FIG. 10 is a schematic diagram of a manufacturing process of a photosensitive assembly according to a preferred example of the disclosure.
Figure 11:
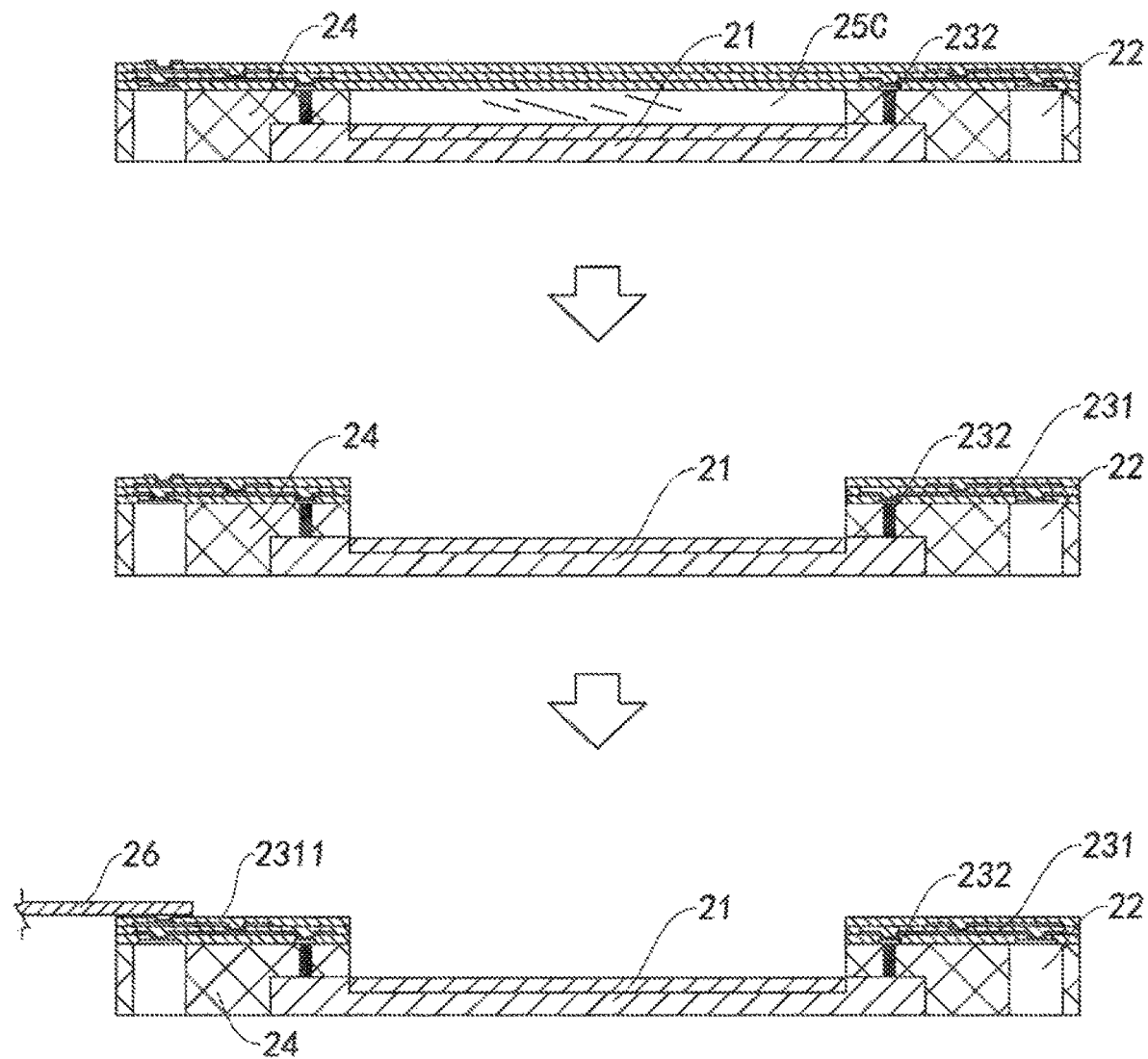
FIG. 11 is a schematic diagram of the manufacturing process of the photosensitive assembly according to the above preferred example of the disclosure.

FIG. 10 to FIG. 11 show a schematic diagram of another manufacturing process of the photosensitive assembly 20 disclosed according to a preferred example and modified examples of the disclosure.

An expanded wiring layer 231 is firstly provided, and then the photosensitive chip 21, the at least one resistance-capacitance device 22, and the conducting element 232 are mounted to the expanded wiring layer 231. It should be noted that in order to prevent the photosensitive area 211 of the photosensitive chip 21 from being polluted during subsequent manufacturing, a light-transmitting element 25 may optionally be stacked on the photosensitive chip 21. The light-transmitting element 25 covers at least the photosensitive area 211 of the photosensitive chip 21. As previously described, the light-transmitting element 25 may be implemented as a filter element 25A, a protective element 25B, or a sacrificial element 25C, corresponding to changes of different light-transmitting elements 25 during subsequent manufacturing. In particular, in the disclosure, a height of the light-transmitting element 25 is equal to that of the conducting element 232.

A molded base 24 is formed to be integrally combined with the photosensitive chip 21, the resistance-capacitance device 22, the conducting element 232, and the expanded wiring layer 231. In this way, unlike the above examples, there is no need to intentionally keep the top surface of the resistance-capacitance device 22 and the top surface of the conducting element 232 flush to ensure connection of the resistance-capacitance device 22 and the conducting element 232 to the expanded wiring layer 231. The resistance-capacitance device 22 and the conducting element 232 are directly mounted to the expanded wiring layer 231.

Further, a light hole 230 is formed in the expanded wiring layer 231 by, for example, exposure, acid etching, etc. The light hole 230 corresponds to at least the photosensitive area 211 of the photosensitive chip 21.

It is worth mentioning that when the light-transmitting element 25 is implemented as a sacrificial element 25C, the manufacturing process of the photosensitive assembly 20 may further include an operation of removing the sacrificial element 25C by, for example, exposure, acid etching, etc.

Further, the circuit external connection layer 26 is electrically connected to the top surface 2311 of the expanded wiring layer 231.

Further, the semi-finished photosensitive assembly 20 is tested.

Of course, in another example of the disclosure, the manufacturing process of the photosensitive assembly 20 further includes the following steps.

A second expanded wiring layer 231A is formed on the bottom side of the photosensitive assembly 20. The second expanded wiring layer 231A is electrically connected to the expanded wiring layer 231 by means of a second conducting element 232A. It should be appreciated that the second conducting element 232A may optionally be pre-buried in the molded base 24 in the step of forming the molded base 24 so that the second expanded wiring layer 231A can be electrically connected to the expanded wiring layer 231 by means of the second conducting element 232A after the second expanded wiring layer 231A is formed. Of course, it would have readily occurred to those skilled in the art that in the step of manufacturing the molded base 24, a conducting element mounting hole 2320 may be selected to be reserved in the molded base 24 for mounting the second conducting element 232A so that the second expanded wiring layer 231A can be electrically connected to the expanded wiring layer 231 by means of the second conducting element 232A after the second expanded wiring layer 231A is formed.

Figure 12:
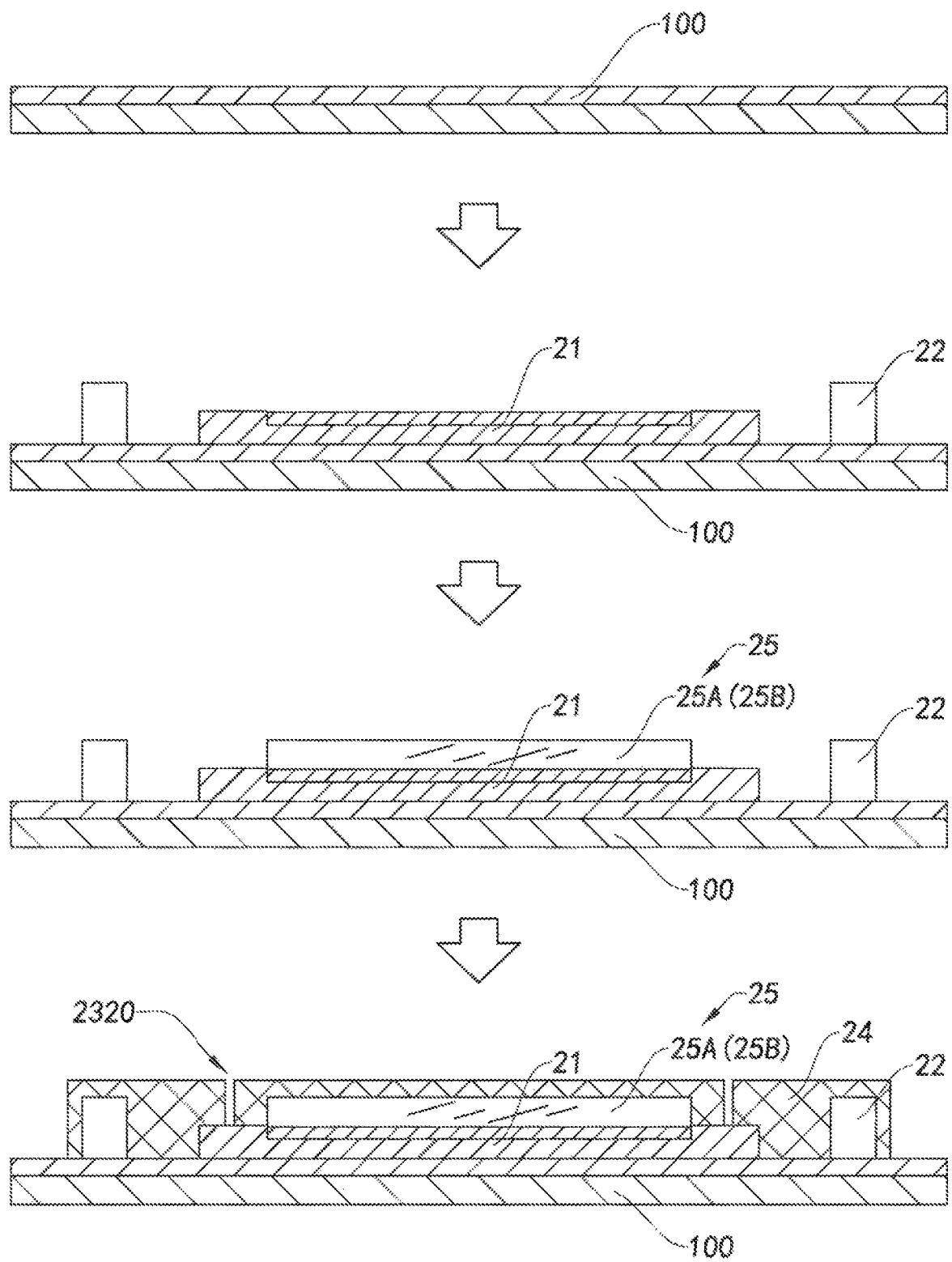
FIG. 12 is a schematic diagram of a manufacturing process of a photosensitive assembly according to a preferred example of the disclosure.
Figure 13:
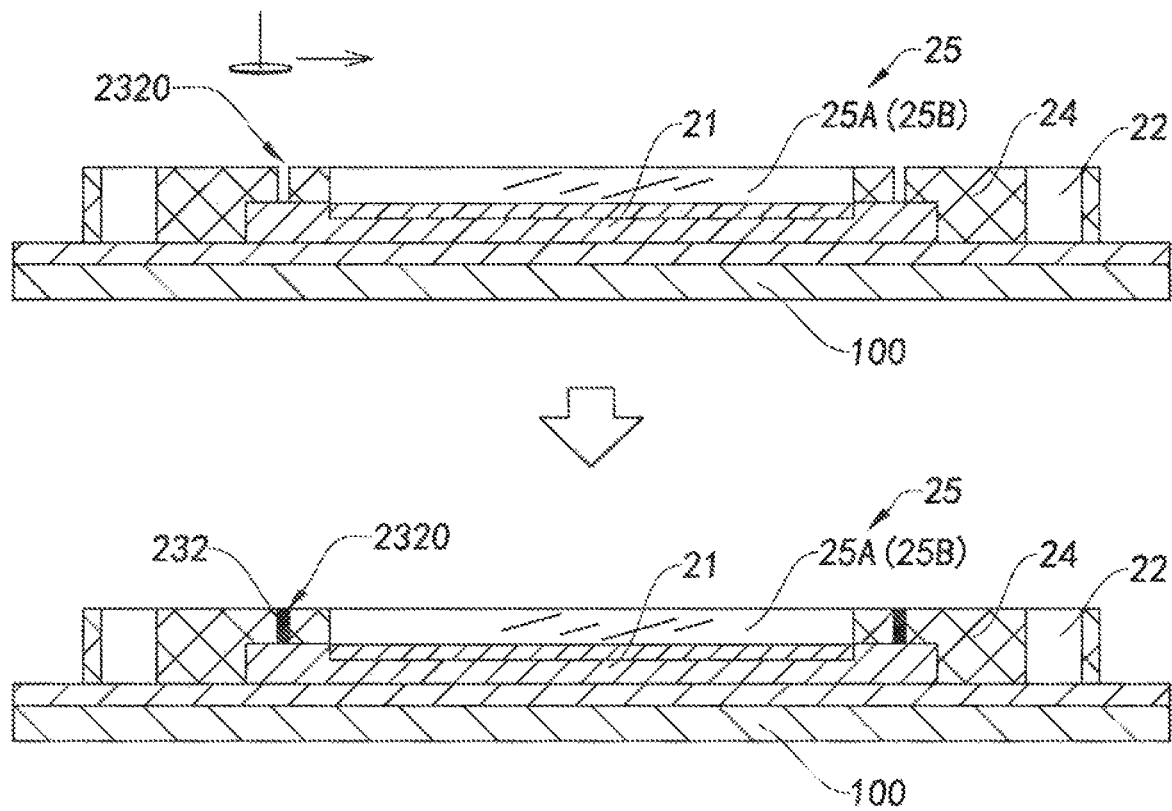
FIG. 13 is a schematic diagram of the manufacturing process of the photosensitive assembly according to the above preferred example of the disclosure.
Figure 14:
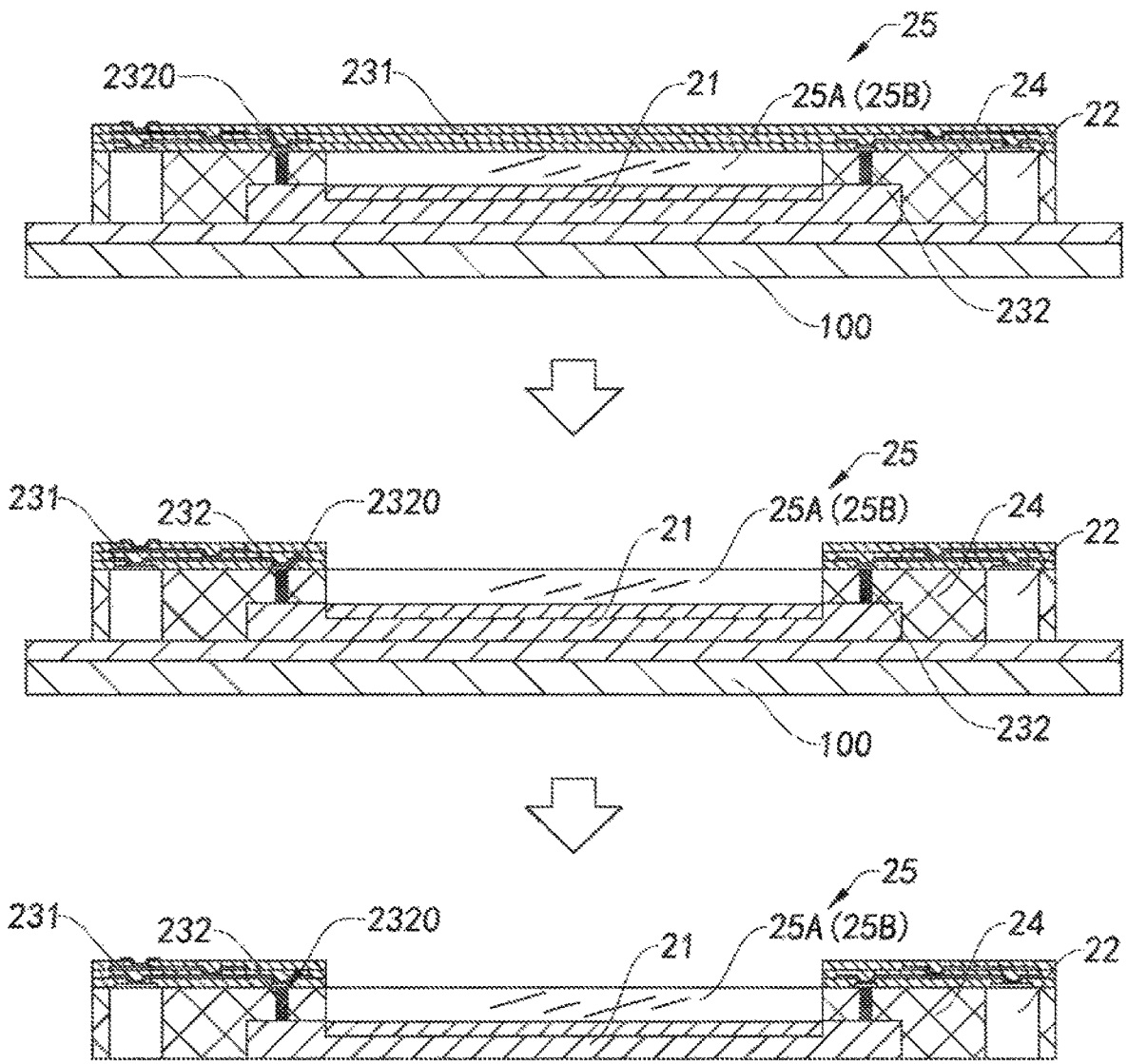
FIG. 14 is a schematic diagram of the manufacturing process of the photosensitive assembly according to the above preferred example of the disclosure.

FIGS. 12 to 14 show a schematic diagram of another manufacturing process of the photosensitive assembly 20 disclosed according to a preferred example and modified examples of the disclosure. When the photosensitive assembly 20 is manufactured, a manufacturing carrier 100 is firstly provided to provide a carrying attachment position for subsequent manufacturing of the photosensitive assembly 20.

Further, a light-transmitting element 25 is stacked on the photosensitive chip 21 to cover at least the photosensitive area 211 of the photosensitive chip 21. It should be appreciated that the light-transmitting element 25 serves to prevent the photosensitive area 211 of the photosensitive chip 21 from being polluted during subsequent manufacturing. The light-transmitting element 25 covers at least the photosensitive area 211 of the photosensitive chip 21. As previously described, the light-transmitting element 25 may be implemented as a filter element 25A, a protective element 25B, or a sacrificial element 25C, corresponding to changes of different light-transmitting elements 25 during subsequent manufacturing. In particular, in the disclosure, a height of the light-transmitting element 25 is equal to that of the conducting element 232 mounted subsequently.

Further, a molded base 24 is formed to be integrally combined with the photosensitive chip 21 and at least one resistance-capacitance device 22. The molded base 24 has a conducting element mounting hole 2320 for mounting the conducting element 232. Then, the conducting element 232 is mounted in the conducting element mounting hole 2320. It is worth mentioning that prior to mounting of the conducting element 232, a part of the molded base 24 needs to be removed by, for example, grinding, cutting, etc. to expose the light-transmitting element 25 to the molded base.

Further, an expanded wiring layer 231 is formed on the molded base 24 to electrically connect the at least one resistance-capacitance device 22 and the conducting element 232 so that the photosensitive chip 21 and the at least one resistance-capacitance device 22 are conducted by means of the expanded wiring layer 231.

Further, a light hole 230 is formed in the expanded wiring layer 231 by, for example, exposure, acid etching, etc. The light hole 230 corresponds to at least the photosensitive area 211 of the photosensitive chip 21.

It is worth mentioning that when the light-transmitting element 25 is implemented as a sacrificial element 25C, the manufacturing process of the photosensitive assembly 20 may further include an operation of removing the sacrificial element 25C by, for example, exposure, acid etching, etc.

Further, the circuit external connection layer is electrically connected to the top surface of the expanded wiring layer.

Further, the semi-finished photosensitive assembly 20 is tested.

Of course, in another example of the disclosure, the manufacturing process of the photosensitive assembly 20 further includes the following steps.

A second expanded wiring layer 231A is formed on the bottom side of the photosensitive assembly 20. The second expanded wiring layer 231A is electrically connected to the expanded wiring layer 231 by means of a second conducting element 232A. It should be appreciated that the second conducting element 232A may optionally be pre-buried in the molded base 24 in the step of forming the molded base 24 so that the second expanded wiring layer 231A can be electrically connected to the expanded wiring layer 231 by means of the second conducting element 232A after the second expanded wiring layer 231A is formed. Of course, it would have readily occurred to those skilled in the art that in the step of manufacturing the molded base 24, a conducting element mounting hole 2320 may be selected to be reserved in the molded base 24 for mounting the second conducting element 232A so that the second expanded wiring layer 231A can be electrically connected to the expanded wiring layer 231 by means of the second conducting element 232A after the second expanded wiring layer 231A is formed.

According to another aspect of the disclosure, the disclosure also provides an electronic device 80. The electronic device includes an electronic device body 81 and a camera module 82 disclosed by the disclosure. The camera module 82 is assembled to the electronic device body 81 to provide an imaging function for the electronic device 80.

Figure 15:
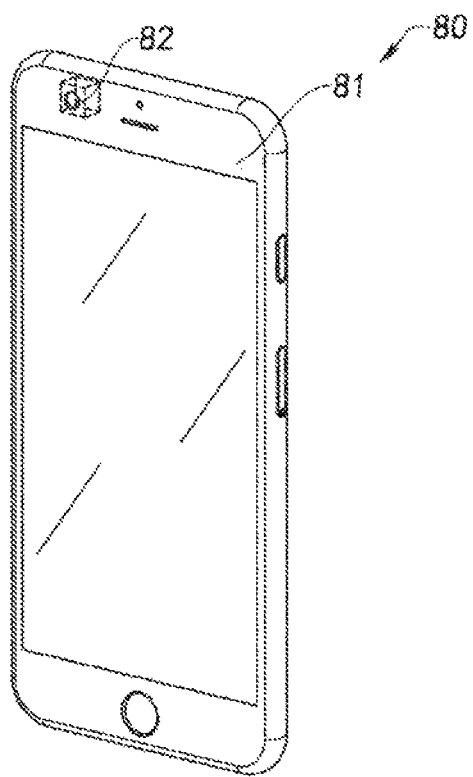
FIG. 15 is a schematic diagram of an electronic device according to a preferred example of the disclosure.
Figure 16:
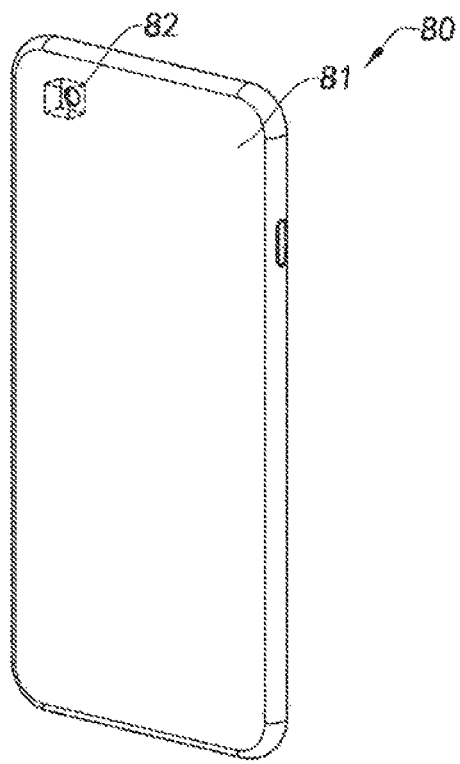
FIG. 16 is a schematic diagram of an electronic device according to a preferred example of the disclosure.

In particular, in a specific implementation mode of the electronic device 80 provided by the disclosure, the camera module 82 may be assembled on a front side of the electronic device body 81. That is to say, the camera module is a front camera module of the electronic device 80, as shown in FIG. 15. Or, the camera module 82 may be assembled on a rear side of the electronic device body 81. That is to say, the camera module 82 is a rear camera module of the electronic device 80, as shown in FIG. 16. Of course, in another implementation mode of the disclosure, the camera module 82 may be assembled to other positions of the electronic device body 81, which is not limited by the disclosure.

Thus, it can be seen that the object of the disclosure may be fully and efficiently accomplished. The examples, which serve to explain the functional and structural principles of the disclosure, have been fully illustrated and described, and the disclosure is not limited to modifications based on the principles of these examples. Therefore, the disclosure includes all modifications encompassed within the scope and spirit of the appended claims.

What is claimed is:

1. A photosensitive assembly, characterized by comprising:
   a photosensitive chip, including a photosensitive area and an electric connection area located around the photosensitive area;
   at least one resistance-capacitance device;
   an expanded wiring assembly, wherein the photosensitive chip and the at least one resistance-capacitance device is electrically connected to the expanded wiring assembly, respectively, so that the at least one resistance-capacitance device and the photosensitive chip are conducted by means of the expanded wiring assembly, and the expanded wiring assembly includes an expanded wiring layer having a top surface and a bottom surface and a conducting element, and the at least one resistance-capacitance device is electrically connected to the bottom surface of the expanded wiring layer, and the conducting element extends between the bottom surface of the expanded wiring layer and the electric connection area of the photosensitive chip, so as to electrically connect the photosensitive chip to the expanded wiring layer by means of the conducting element, and a light hole is formed in the expanded wiring layer and corresponds to at least the photosensitive area of the photosensitive chip; and
   a molded base, in which the photosensitive chip and the resistance-capacitance device are received respectively and on which the expanded wiring layer is supported;
   wherein the expanded wiring layer includes an expanded circuit having a first electric connection end and a second electric connection end, and the first electric connection end is electrically connected to the conducting element, and the second electric connection end extends laterally from the first electric connection end in a direction away from the conducting element and is electrically connected to the at least one resistance-capacitance device.

2. The photosensitive assembly of claim 1, further including: a light-transmitting element stacked on the photosensitive chip to cover at least the photosensitive area of the photosensitive chip.

3. The photosensitive assembly of claim 1, wherein the light-transmitting element is implemented as a filter element or a protective element.

4. The photosensitive assembly of claim 2, wherein a height dimension of the light-transmitting element is equal to a height dimension of the conducting element.

5. The photosensitive assembly of claim 1, wherein the at least one resistance-capacitance device is located on two sides of the photosensitive chip.

6. The photosensitive assembly of claim 5, wherein the photosensitive chip and the at least one resistance-capacitance device are located on the same side of the expanded wiring assembly.

7. The photosensitive assembly of claim 1, wherein the top surface of the expanded wiring layer forms a top surface of the photosensitive assembly, and the top surface of the expanded wiring layer is a plane.

8. The photosensitive assembly of claim 1, wherein a size of the first electric connection end is smaller than that of the second electric connection end.

9. The photosensitive assembly of claim 4, wherein a size of the first electric connection end is smaller than that of the second electric connection end.

10. The photosensitive assembly of claim 1, wherein the molded base has a conducting element receiving hole extending between the electric connection area of the photosensitive chip and the bottom surface of the expanded wiring layer for receiving the conducting element.

11. The photosensitive assembly of claim 1, wherein the expanded wiring assembly further includes a second expanded wiring layer which is electrically connected to the expanded wiring layer and located on a bottom side of the photosensitive assembly, and the photosensitive assembly further includes a circuit external connection layer electrically connected to a bottom surface of the second expanded wiring layer.

12. The photosensitive assembly of claim 1, wherein the molded base is integrally combined with the photosensitive chip and the resistance-capacitance device.

13. The photosensitive assembly of claim 12, wherein the molded base is integrally combined with the conducting element.

14. A camera module, characterized by comprising:
   a photosensitive assembly of claim 1; and
   an optical lens, held in a photosensitive path of the photosensitive assembly.

15. The camera module of claim 14, further including: a lens carrying element mounted to the top surface of the first expanded wiring layer and corresponding to the photosensitive path of the photosensitive assembly, wherein the optical lens is mounted to the lens carrying element so that the optical lens is held in the photosensitive path of the photosensitive assembly.

16. The camera module of claim 15, wherein the lens carrying element is a static support element.

17. The camera module of claim 15, wherein the lens carrying element is a drive element.

18. A photosensitive assembly manufacturing method, characterized by comprising the following steps:
   electrically connecting a conducting element to an electric connection area of a photosensitive chip, wherein the conducting element extends upwards from the electric connection area of the photosensitive chip in a direction away from the photosensitive chip;
   forming a molded base to be integrally combined with the photosensitive chip, at least one resistance-capacitance device, and the conducting element;
   forming an expanded wiring layer on the molded base to electrically connect the at least one resistance-capacitance device and the conducting element; and
   forming a light hole in the expanded wiring layer, wherein the light hole corresponds to at least the photosensitive area of the photosensitive chip.

19. The photosensitive assembly manufacturing method of claim 18, further including the following step before forming the molded base:
   stacking a light-transmitting element on the photosensitive chip to cover at least the photosensitive area of the photosensitive chip.

20. The photosensitive assembly manufacturing method of claim 18, further including the following step when the light-transmitting element is implemented as a sacrificial element:
   removing the sacrificial element stacked on the photosensitive chip.

* * * * *